United States Patent
Bakken et al.

(10) Patent No.: US 10,067,619 B2
(45) Date of Patent: Sep. 4, 2018

(54) CAPACITIVE MEASUREMENT CIRCUIT FOR A TOUCH SENSOR DRIVE

(71) Applicant: Atmel Corporation, San Jose, CA (US)

(72) Inventors: Vemund Kval Bakken, San Francisco, CA (US); Steinar Myren, Vikhamar (NO); Trond Jarle Pedersen, Saupstad (NO)

(73) Assignee: Atmel Corporation, Chandler, AZ (US)

( * ) Notice: Subject to any disclaimer, the term of this patent is extended or adjusted under 35 U.S.C. 154(b) by 188 days.

(21) Appl. No.: 14/885,061

(22) Filed: Oct. 16, 2015

(65) Prior Publication Data

US 2016/0098123 A1    Apr. 7, 2016

Related U.S. Application Data

(63) Continuation of application No. 14/093,899, filed on Dec. 2, 2013, now Pat. No. 9,164,136.

(51) Int. Cl.
| | |
|---|---|
| *G01R 27/26* | (2006.01) |
| *G06F 3/044* | (2006.01) |
| *G06F 3/041* | (2006.01) |
| *G01D 5/24* | (2006.01) |

(52) U.S. Cl.
CPC ............ *G06F 3/044* (2013.01); *G01D 5/24* (2013.01); *G01R 27/2605* (2013.01); *G06F 3/0418* (2013.01)

(58) Field of Classification Search
USPC .............................................. 324/661–686
See application file for complete search history.

(56) References Cited

U.S. PATENT DOCUMENTS

| | | |
|---|---|---|
| 3,805,149 A | 4/1974 | Delapierre |
| 6,194,903 B1 | 2/2001 | Schulz |
| 6,456,477 B1 | 9/2002 | McIntosh |

(Continued)

FOREIGN PATENT DOCUMENTS

| | | |
|---|---|---|
| CN | 101673164 A | 3/2010 |
| CN | 103109194 A | 5/2013 |

(Continued)

OTHER PUBLICATIONS

U.S. Appl. No. 61/454,936, filed Mar. 21, 2011, Myers.

(Continued)

*Primary Examiner* — Vincent Q Nguyen
(74) *Attorney, Agent, or Firm* — Baker Botts L.L.P.

(57) ABSTRACT

In one embodiment, a method for determining the location of a touch on a touch sensor includes receiving input signals in response to a touch proximate to a location on the touch sensor. Each input signal may have a total capacitance that includes a first capacitance associated with the touch and a second capacitance that is parasitic capacitance. The parasitic capacitance of one or more of the input signals may be adjusted to result in the second capacitance of each of the input signals being substantially equal. An average capacitance of the adjusted input signals may be calculated. The location of the touch on the touch sensor may then be determined based on a comparison of the total capacitance of each of the input signals and the average capacitance of the input signals.

15 Claims, 4 Drawing Sheets

(56) References Cited

U.S. PATENT DOCUMENTS

| | | |
|---|---|---|
| 6,977,646 B1 | 12/2005 | Hauck |
| 7,288,945 B2 | 10/2007 | Martinez |
| 7,501,836 B2 | 3/2009 | Hansen |
| 7,567,240 B2 | 7/2009 | Peterson |
| 7,663,607 B2 | 2/2010 | Hotelling |
| 7,875,814 B2 | 1/2011 | Chen |
| 7,920,129 B2 | 4/2011 | Hotelling |
| 8,031,094 B2 | 10/2011 | Hotelling |
| 8,031,174 B2 | 10/2011 | Hamblin |
| 8,040,326 B2 | 10/2011 | Hotelling |
| 8,049,732 B2 | 11/2011 | Hotelling |
| 8,179,381 B2 | 5/2012 | Frey |
| 8,519,722 B1 | 8/2013 | Prendergast |
| 2004/0004488 A1 | 1/2004 | Baxter |
| 2005/0030046 A1 | 2/2005 | Yakabe |
| 2005/0068044 A1 | 3/2005 | Peine |
| 2006/0267953 A1 | 11/2006 | Peterson |
| 2007/0074913 A1* | 4/2007 | Geaghan ............ G06F 3/044 178/18.06 |
| 2007/0268272 A1 | 11/2007 | Perski |
| 2008/0170046 A1 | 7/2008 | Rimon |
| 2009/0025987 A1 | 1/2009 | Perski |
| 2009/0160461 A1 | 6/2009 | Zangl |
| 2009/0315854 A1 | 12/2009 | Matsuo |
| 2010/0060608 A1 | 3/2010 | Yousefpor |
| 2010/0073301 A1 | 3/2010 | Yousefpor |
| 2010/0073323 A1 | 3/2010 | Geaghan |
| 2011/0115729 A1* | 5/2011 | Kremin ............ G06F 3/0418 345/173 |
| 2011/0242050 A1 | 10/2011 | Byun |
| 2011/0279170 A1 | 11/2011 | Cormier, Jr. |
| 2012/0024064 A1 | 2/2012 | Wu |
| 2012/0194492 A1 | 8/2012 | Hadwen |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |
| 2013/0069671 A1 | 3/2013 | Pedersen |
| 2013/0076612 A1 | 3/2013 | Myers |
| 2013/0106779 A1 | 5/2013 | Company Bosch |
| 2013/0120005 A1 | 5/2013 | Magnusson |
| 2013/0187704 A1* | 7/2013 | Edwards ............ H03K 17/962 327/517 |
| 2013/0249570 A1 | 9/2013 | Voelkel |
| 2013/0285972 A1 | 10/2013 | Elias |
| 2014/0354582 A1* | 12/2014 | Horne ............ G06F 3/044 345/174 |

FOREIGN PATENT DOCUMENTS

| | | |
|---|---|---|
| TW | 2012 43687 A | 11/2012 |
| TW | 2013 31804 A | 8/2013 |
| WO | WO 2012/129247 | 9/2012 |

OTHER PUBLICATIONS

U.S. Appl. No. 61/454,950, filed Mar. 21, 2011, Lynch.

U.S. Appl. No. 61/454,894, filed Mar. 21, 2011, Rothkopf.

Office Action issued by the Intellectual Property Office (IPO) of (ROC) Taiwan for Patent Application No. 103141833—May 2, 2018.

First Office Action Issued by the State Intellectual Property Office of China for Application No. 201410640098.7 (English translation attached)—Jun. 5, 2018.

\* cited by examiner

CAPACITIVE MEASUREMENT CIRCUIT FOR A TOUCH SENSOR DRIVE

RELATED APPLICATION

This application is a continuation, under 35 U.S.C. § 120, of U.S. patent application Ser. No. 14/093,899, filed Dec. 2, 2013, which is incorporated herein by reference.

TECHNICAL FIELD

This disclosure generally relates to touch sensors.

BACKGROUND

A touch sensor may detect the presence and location of a touch or object or the proximity of an object (such as a user's finger or a stylus) within a touch-sensitive area of the touch sensor overlaid on a display screen, for example. In a touch sensitive display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as, for example, resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

DESCRIPTION OF EXAMPLE EMBODIMENTS

Figure 1:
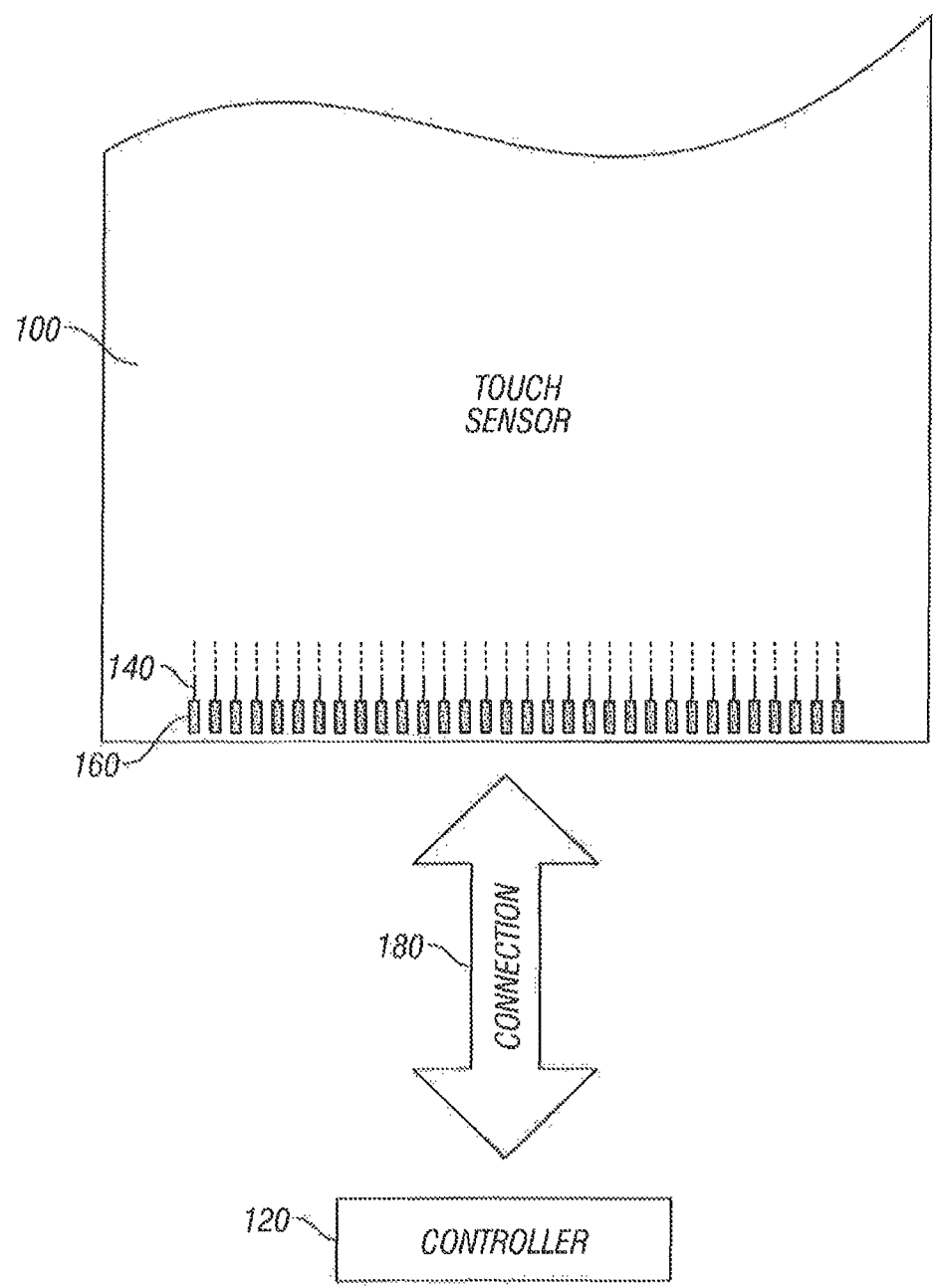
FIG. 1 illustrates an example touch sensor with an example touch-sensor controller.

FIG. 1 illustrates an example touch sensor 100 with an example touch-sensor controller 120. Touch sensor 100 and touch-sensor controller 120 may detect the presence and location of a touch or the proximity of an object within a touch-sensitive area of touch sensor 100. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 100 may include one or more touch-sensitive areas, where appropriate. Touch sensor 100 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a ground electrode, a guard electrode, a drive electrode, or a sense electrode) may be an area of conductive material forming a shape, such as for example a disc, square, rectangle, thin line, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of fine lines of metal or other conductive material (FLM), such as for example copper, silver, or a copper- or silver-based material, and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fill percentages having particular patterns, this disclosure contemplates any suitable electrodes made of any suitable conductive material forming any suitable shapes with any suitable fill percentages having any suitable patterns. Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 100. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 100 and touch-sensor controller 120. As an example only and not by way of limitation, the cover panel may have a thickness of approximately 1 millimeter (mm); the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 100 may be made of polyethylene terephthalate (PET) or another suitable material. This disclosure contemplates any suitable substrate with any suitable portions made of any suitable material. In particular embodiments, the drive or sense electrodes in touch sensor 100 may be made of ITO in whole or in part. In particular embodiments, the drive or sense electrodes in touch sensor 100 may be made of fine lines of metal or other conductive material. As an example and not by way of limitation, one or more portions of the conductive material may be copper or copper-based and have a thickness of approximately 5 microns ($\mu$m) or less and a width of approximately 100 $\mu$m or less. As another example, one or more portions of the conductive material may be silver or silver-based and similarly have a thickness of approximately 5 $\mu$m or less and a width of approximately 100 $\mu$m or less. This disclosure contemplates any suitable electrodes made of any suitable material.

Touch sensor 100 may implement a capacitive form of touch sensing. In a mutual-capacitance implementation, touch sensor 100 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 120) may induce a charge on the sense electrode, and the amount of charge induced may be susceptible to external influence (such as a touch or the proximity of an object). When an object touches or comes within proximity of the capacitive node, a change in capacitance may occur at the capacitive node and a measurement circuit of touch-sensor controller 120 may measure the change in capacitance. By measuring changes in capacitance throughout the array, touch-sensor controller 120 may determine the position of the touch or proximity within the touch-sensitive area(s) of touch sensor 100.

In a self-capacitance implementation, touch sensor 100 may include an array of electrodes of a single type that may each form a capacitive node. When an object touches or comes within proximity of the capacitive node, a change in self-capacitance may occur at the capacitive node and touch-sensor controller 120 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 120 may determine the position of the touch or proximity within the touch-sensitive area(s) of touch sensor 100. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 100 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 100 may have drive electrodes disposed in a pattern on one side of a substrate and sense electrodes disposed in a pattern on another side of the substrate. Moreover, touch sensor 100 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 100 may indicate a touch or proximity input at the position of the capacitive node. Touch-sensor controller 120 may detect and process the change in capacitance to determine the presence and location of the touch or proximity input. Touch-sensor controller 120 may then communicate information about the touch or proximity input to one or more other components (such one or more central processing units (CPUs)) of a device that includes touch sensor 100 and touch-sensor controller 120, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 120 may be one or more integrated circuits (ICs), such as for example general-purpose microprocessors, microcontrollers, programmable logic devices or arrays, application-specific ICs (ASICs). In particular embodiments, touch-sensor controller 120 comprises analog circuitry, digital logic, and digital non-volatile memory. In particular embodiments, touch-sensor controller 120 is disposed on a flexible printed circuit (FPC) bonded to the substrate of touch sensor 100, as described below. The FPC may be active or passive, where appropriate. In particular embodiments, multiple touch-sensor controllers 120 are disposed on the FPC. Touch-sensor controller 120 may include a processor unit, a drive unit, a sense unit, and a storage unit. The drive unit may supply drive signals to the drive electrodes of touch sensor 100. The sense unit may sense charge at the capacitive nodes of touch sensor 100. The sense unit may include a measurement circuit that measures the capacitances at the capacitive nodes and provides measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 100. The processor unit may also track changes in the position of a touch or proximity input within the touch-sensitive area(s) of touch sensor 100. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 140 of conductive material disposed on the substrate of touch sensor 100 may couple the drive or sense electrodes of touch sensor 100 to connection pads 160, also disposed on the substrate of touch sensor 100. As described below, connection pads 160 facilitate coupling of tracks 140 to touch-sensor controller 120. Tracks 140 may extend into or around (e.g. at the edges of) the touch-sensitive area(s) of touch sensor 100. Particular tracks 140 may provide drive connections for coupling touch-sensor controller 120 to drive electrodes of touch sensor 100, through which the drive unit of touch-sensor controller 120 may supply drive signals to the drive electrodes. Other tracks 140 may provide sense connections for coupling touch-sensor controller 120 to sense electrodes of touch sensor 100, through which the sense unit of touch-sensor controller 120 may sense charge at the capacitive nodes of touch sensor 100. Tracks 140 may be made of fine lines of metal or other conductive material. As an example and not by way of limitation, the conductive material of tracks 140 may be copper or copper-based and have a width of approximately 1000 μm or less. As another example, the conductive material of tracks 140 may be silver or silver-based and have a width of approximately 1000 μm or less. In particular embodiments, tracks 140 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 140, touch sensor 100 may include one or more ground lines terminating at a ground connector (which may be a connection pad 160) at an edge of the substrate of touch sensor 100 (similar to tracks 140).

Connection pads 160 may be located along one or more edges of the substrate, outside the touch-sensitive area(s) of touch sensor 100. As described above, touch-sensor controller 120 may be on an FPC. Connection pads 160 may be made of the same material as tracks 140 and may be bonded to the FPC using an anisotropic conductive film (ACF). Connection 180 may include conductive lines on the FPC coupling touch-sensor controller 120 to connection pads 160, in turn coupling touch-sensor controller 120 to tracks 140 and to the drive or sense electrodes of touch sensor 100. In other embodiments, connection pads 160 may be connected an electro-mechanical connector (such as a zero insertion force wire-to-board connector). In these embodiments, connection 180 may not need to include an FPC. This disclosure contemplates any suitable connection 180 between touch-sensor controller 120 and touch sensor 100.

Figure 2:
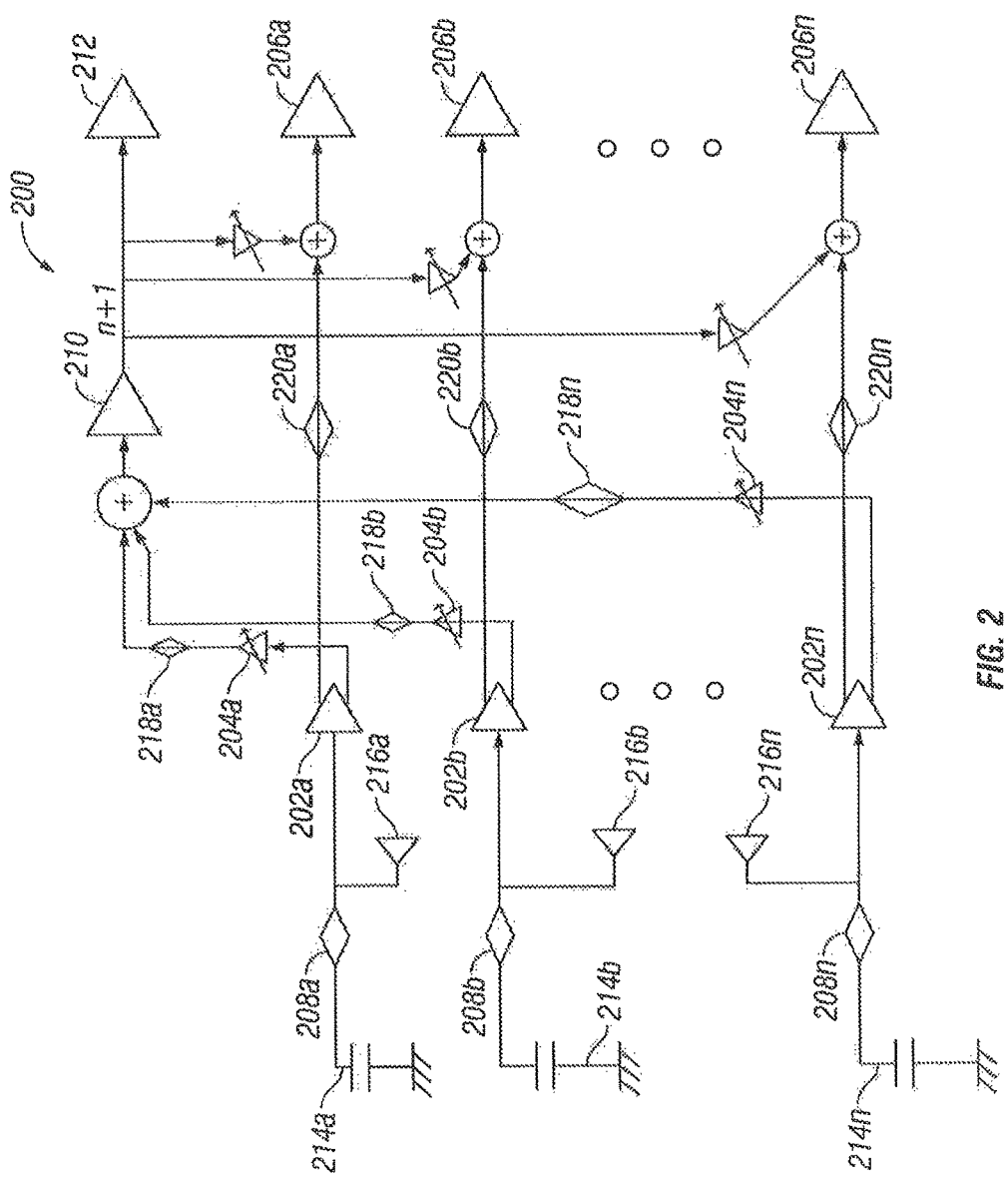
FIG. 2 illustrates an example measurement circuit of a touch-sensor controller.

FIG. 2 illustrates an example measurement circuit 200 of touch-sensor controller 120. In particular embodiments, the measurement circuit 200 includes an input buffer $202_{a-n}$, at least one compensation buffer $204_{a-n}$, and an integrator $206_{a-n}$ for each input signal $208_{a-n}$ that is received. Additionally, measurement circuit 200 includes a current summer/divider 210 that provides mirrored output to a proximity circuit 212 and each of the integrators $206_{a-n}$.

A pad driver $216_{a-n}$ may be associated with each sense line $214_{a-n}$ and input signal $208_{a-n}$. Each input signal $208_{a-n}$, $i_{in\ a-n}$, is received at an input buffer $202_{a-n}$ associated with that particular sense line $214_{a-n}$ of touch sensor 100. Input buffers $202_{a-n}$ may be configured to amplify the current and generate dual outputs. For example, each input buffer $202_{a-n}$ may output a first output signal $218_{a-n}$, $i_{od\ a-n}$, that is transmitted to and received by the current summer/divider 210 and a second output signal $220_{a-n}$, $i_{oint\ a-n}$, that is transmitted to and received by an integrator $206_{a-n}$ that is associated with the same sense line $214_{a-n}$. For example, in the depicted example measurement circuit 200, first input signal $208_a$, $i_{in\ a}$, is received by input buffer $202_a$, which then outputs a first output signal $218_a$, $i_{od\ a}$, that is transmitted to current summer/divider 210 and a second signal $220_a$, $i_{oint\ a}$, that is transmitted to and received by integrator $206_a$. Input buffers $202_{b-n}$ are depicted similarly.

In particular embodiments, each input signal $208_{a-n}$ includes both a touch capacitance, $C_F$, and a parasitic capacitance, $C_P$. Where a touch sensor 100 includes uniform sense lines $214_{a-n}$, the parasitic capacitance of each input $208_{a-n}$ will be substantially the same. Thus, if a touch is present at the electrode associated with input signal $208_a$, the difference between the total capacitance measured on input signal $208_a$ and the total capacitance measured on input signal $208_b$ will be representative of the touch capacitance, $C_F$. In particular embodiments, current summer/divider 210 may receive the total capacitance for each input signal $208_{a-n}$ and compute an average capacitance. For example, current summer/divider 210 may add the total capacitance of each input signal $208_{a-n}$ together and then divide the summed total of all capacitance by the total number of input signals, n, to calculate the average capacitance. This average capacitance can then be subtracted from each total capacitance to substantially remove the parasitic capacitance.

However, where a screen is not uniform and includes non-uniform sense lines, the input $208_{a-n}$ associated with the sense lines will exhibit different amounts of parasitic capacitance. Additionally, if two sense lines are coupled, a positive signal on one sense line $214_{a-n}$ may cancel out a negative signal on another sense line $214_{a-n}$. Accordingly, in a particular embodiment, measurement circuit 200 includes one or more compensation buffers $204_{a-n}$ for each input signal $208_{a-n}$. Compensation buffers $204_{a-n}$ may include linearizers configured to linearize touch sensor 200 by applying a scaling factor to the first output signal $218_{a-n}$. For example, assume input signal $208_a$ includes ten percent more parasitic capacitance than the other input signals $208_{b-n}$. If the input signals $208_{a-n}$ are not linearized, the current summer/divider 210 will receive 10% more parasitic capacitance from the sense line $214_a$ associated with input signal $208_a$ than from the sense lines $214_{b-n}$ associated with input signals $208_{b-n}$.

Accordingly, in a particular embodiment, compensation buffers $204_{a-n}$ may be configured to reduce the effect of parasitic difference between sense lines by adjusting the capacitance of the input signals $208_{a-n}$ up or down. Specifically, linearizers 204a-n may be configured to apply a scaling factor, s, to the first output signal $218_{a-n}$. For example, in a particular embodiment, the outputs of each integrator $208_{a-n}$ may be used to linearize the input signals $208_{a-n}$. The scaling factor, s, may be adjusted such that s (1/n)=$i_{oint\ n}$ in the case where a touch is not present upon touch sensor 100. Where a touch is present, the touch will increase $i_{oint\ n}$ by an amount substantially equal to s (1/n) and result in a signal change on the output of the integrator $216_n$. Each node may be adjusted by a scaling factor, s, until all input signals $208_{a-n}$ result in substantially equal outputs. In this manner, example measurement circuit 200 may compensate for the parasitic capacitance exhibited by each input signals $208_{a-n}$.

As stated above, current summer/divider 210 may receive each first output signal $218_{a-n}$ from linearizers $204_{a-n}$ and compute an average capacitance, $C_{AVG}$. The average capacitance represents the average current of all channels multiplied by the scaling factor, s. For example, current summer/divider 210 may add the total capacitance of each output signal $218_{a-n}$ together and then divide the summed total of all capacitance by the total number of input signals, n, to calculate the average capacitance. Thus, the average capacitance may be represented as s ($i_s$/n).

Each integrator $206_{a-n}$ may then receive the average capacitance from current summer/divider 210 and the second output signal from an associated input buffer $202_{a-n}$. Thus, an integrator $206_n$ receives average capacitance, s ($i_s$/n), and second output signal, $i_{oint\ n}$. Thus the current into integrator $206_n$ may be calculated as being equal to $i_{oint\ n}$/[s ($i_s$/n)]. Also as depicted, a proximity circuit 212, which operates similar to integrators $206_{a-n}$, may receive only the average capacitance measured by the current summer/divider 210. Proximity circuit 210 may operate to detect inadvertent touches on touch sensor 100. For example, where touch sensor 200 is incorporated into a mobile phone, proximity circuit 212 may operate to turn off touch sensor 100 in response to a user placing a portion of a finger or hand on the touch sensor 100 while the user is currently on a phone call.

Figure 3:
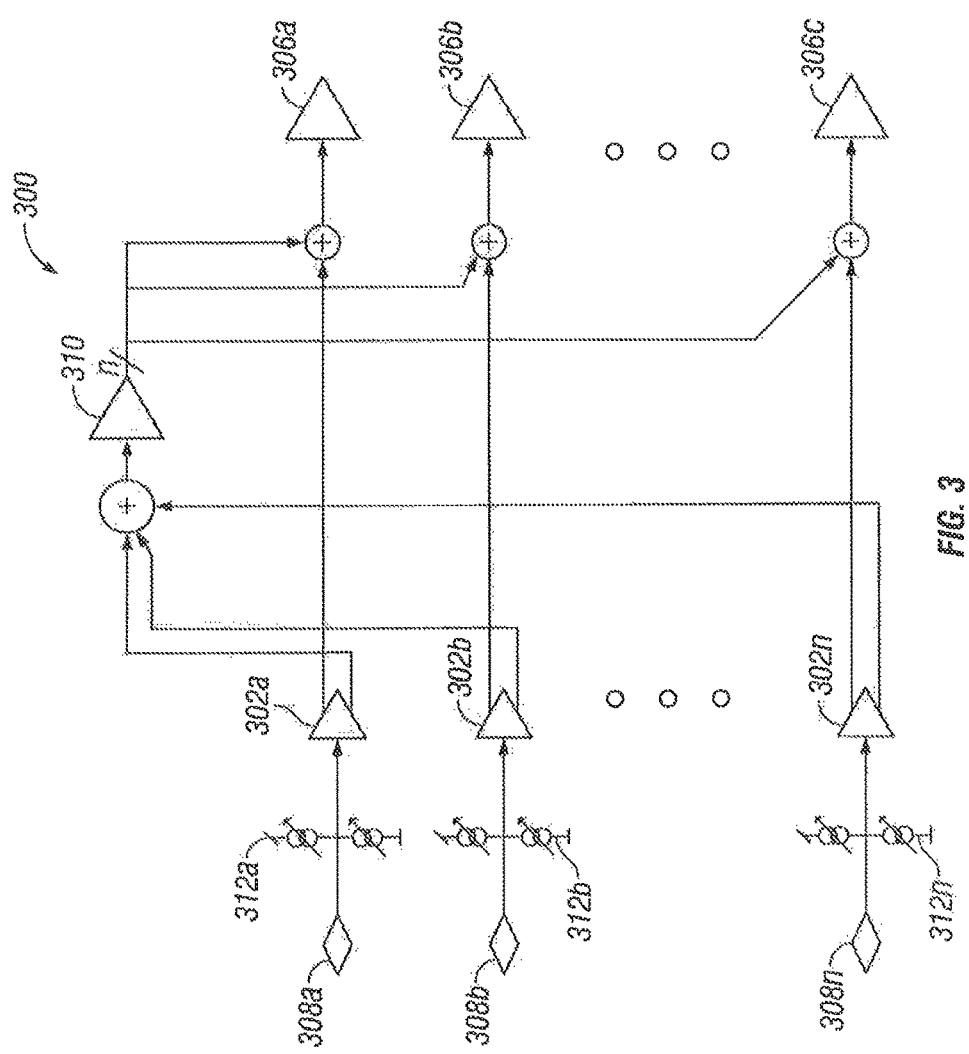
FIG. 3 illustrates another example capacitive measurement circuit of a touch-sensor controller.

FIG. 3 illustrates still another example measurement circuit 300 according to certain embodiments. Example measurement circuit 300 includes some components that may be similar to those described above with regard to example measurement circuit 200. Specifically, measurement circuit 300 includes an input buffer $302_{a-n}$, at least one compensation buffer $304_{a-n}$, and an integrator $306_{a-n}$ for each input signal $308_{a-n}$ that is received. Additionally, measurement circuit 300 includes a current summer/divider 310 that provides n-mirrored output signals to each of integrators $306_{a-n}$.

Each inputs signal $308_{a-n}$ may be received at an input buffer $302_{a-n}$ associated with that particular sense line. Input buffers 302a-n may be configured to amplify the current and generate dual outputs. In a manner similar to that described above with regard to example measurement circuit 200 of FIG. 2, each input buffer $302_{a-n}$ may output a first output that is transmitted to and received by the current summer/divider 310 and a second output that is transmitted to and received by an integrator $306_{a-n}$ that is associated with that same sense line. However, whereas example measurement circuit 200 included compensation buffers $204_{a-n}$ to linearize the first signal that is output by input buffers $202_{a-n}$ before the first signal is received by current summer/divider 210, example measurement circuit 300 uses current sources $312_{a-n}$ to perform the scaling operation. For example, in a particular embodiment, current sources $312_{a-n}$ may inject a compensation current that cancels the parasitic capacitance of the input signal $308_{a-n}$. For example, where the parasitic capacitance is larger in the input signal $308_a$, an proportional amount of current may be injected by current sources $312_{b-n}$ into input signals $308_{a-n}$ so as to make the parasitic capacitance of all signals substantially equal. Additionally or alternatively, current may be removed from input signals $308_a$ to decrease the parasitic capacitance of input signal $308_a$ such that input signals $308_{a-n}$ are of approximately equal parasitic capacitance.

Figure 4:
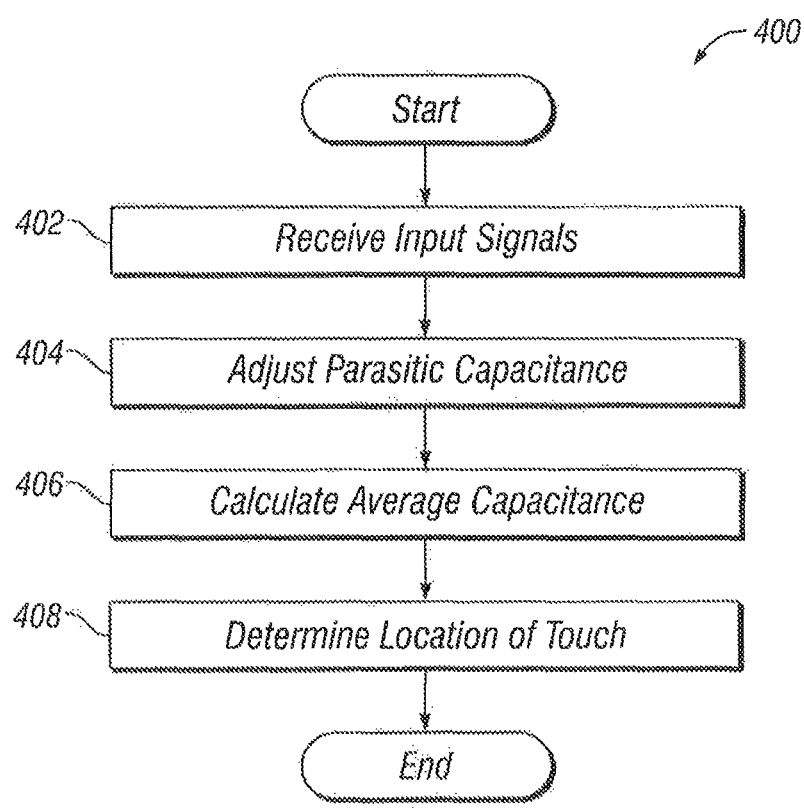
FIG. 4 illustrates steps that may be performed by an example measurement circuit

FIG. 4 illustrates the steps performed by an example measurement circuit such as those described above with regard to FIGS. 2-3. In a particular embodiment, the method 400 may begin in response to a touch proximate to a location on a touch sensor 100. At a step 402, a plurality of input signals may be received in response to the touch. In a particular embodiment, each input signal $208_{a-n}$ may have a total capacitance and may be associated with a sense line of a touch sensor 100. The total capacitance may include a first capacitance associated with the touch and a second capacitance comprising a parasitic capacitance.

At a step 404, the parasitic capacitance of at least one of the plurality of input signals $208_{a-n}$ may be adjusted. In a particular embodiment, a linearizer may be provided for each input signal. The linearizers may operate to adjust the parasitic capacitance of a received input signal to result in the second capacitance of each of the plurality of input signals being substantially equal. In a particular embodiment, an amount of capacitance may be added or subtracted from at least one of the plurality of input signals $208_{a-n}$. For example, capacitance may be subtracted from an input signal $208_a$ having a higher parasitic capacitance than other input signals $208_{b-n}$. Alternatively, capacitance may be added to the other input signals $208_{b-n}$ to increase their parasitic capacitance to be substantially equal to the input signal $208_a$ having the highest parasitic capacitance.

At step 406, an average capacitance of the plurality of input signals $208_{a-n}$ may be calculated from the plurality of adjusted input signals. Specifically, and in a particular embodiment, a current summer/divider 210 may communicated with each linearizer $204_{a-n}$. Current summer/divider 210 may receive the plurality of adjusted input signals $208_{a-n}$ from the plurality of linearizers $204_{a-n}$. Thus, the average capacitance is calculated based on the input signals $208_{a-n}$ having substantially equal parasitic capacitance. Current summer/divider 210 may then calculate the average capacitance by summing the plurality of adjusted input signals $208_{a-n}$ and dividing the sum by the total number of input signals, n. In a particular embodiment, current summer/divider 210 may then generate n output signals, as was described with regard to FIG. 2, or n+1 output signals, as was described with regard to FIG. 3. For example, n+1 output signals may be generated where a proximity circuit 212 is used to detect inadvertent touches that should not be ignored.

At step 408, the location of the touch on the touch sensor 100 may be determined. Specifically, at least one processor may be used to compare the total capacitance of the plurality of input signals $208_{a-n}$ and the average capacitance of the plurality of adjusted input signals $208_{a-n}$. For example, in a particular embodiment, the average capacitance may be subtracted from the total capacitance of each of the input signals $208_{a-n}$ to determine the first capacitance of each input signal $208_{a-n}$. Because the average capacitance is calculated based on input signals $208_{a-n}$ having substantially equal parasitic capacitance, the parasitic capacitance of the plurality of input signals $208_{a-n}$ is substantially negated. As such, the difference between the average capacitance and the total capacitance for an input signal $208_{a-n}$ may be attributed to the capacitance generated by the touch. The input signal $208_{a-n}$ having the highest capacitance attributable by the touch may be used to identify the location of the touch on the touchscreen.

Particular embodiments may repeat the steps of the method of FIG. 4, where appropriate. Moreover, although this disclosure describes and illustrates particular steps of the method of FIG. 4 as occurring in a particular order, this disclosure contemplates any suitable steps of the method of FIG. 4 occurring in any suitable order. Furthermore, although this disclosure describes and illustrates particular components, devices, or systems carrying out particular steps of the method of FIG. 4, this disclosure contemplates any suitable combination of any suitable components, devices, or systems carrying out any suitable steps of the method of FIG. 4.

Herein, reference to a computer-readable non-transitory storage medium may include a semiconductor-based or other integrated circuit (IC) (such as, for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, another suitable computer-readable non-transitory storage medium, or a suitable combination of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed:

1. A capacitance measurement circuit, comprising:
    a plurality of compensation buffers operable to receive a plurality of partial capacitances, respectively, from a plurality of sense lines, respectively, of a touch sensor and to scale the plurality of partial capacitances, respectively, to create a plurality of scaled capacitances;
    a current summer/divider operable to receive the plurality of scaled capacitances from the plurality of compensation buffers and determine an average capacitance of the plurality of scaled capacitances from the plurality of compensation buffers; and
    at least one processor operable to:
    receive, from the current summer/divider, the average capacitance of the plurality of scaled capacitances from the plurality of compensation buffers;
    subtract the average capacitance of the plurality of scaled capacitances of the plurality of compensation buffers from a total capacitance associated with one of the plurality of sense lines to determine a capacitance associated with a touch input on the touch sensor; and
    determine a location on the touch sensor associated with the touch input based on the determined capacitance associated with the touch input.

2. The capacitance measurement circuit of claim 1, wherein each of the plurality of sense lines have a total capacitance comprising:
    a first capacitance associated with the touch input; and
    a second capacitance comprising a parasitic capacitance.

3. The capacitance measurement circuit of claim 2, wherein scaling the plurality of partial capacitances comprises adding or subtracting an amount of capacitance to result in the second capacitance of each of the plurality of scaled capacitances being substantially equal.

4. The capacitance measurement circuit of claim 1, further comprising an input buffer operable to generate, based on the plurality of scaled capacitances, a first output signal and a second output signal, and wherein:
    the current summer/divider uses the first output signal to determine the average capacitance of the plurality of scaled capacitances; and
    the at least one processor is operable to use the second output signal when subtracting the average capacitance from the total capacitance associated with one of the plurality of sense lines.

5. The capacitance measurement circuit of claim 1, further comprising a proximity circuit operable to detect an inadvertent touch on the touch sensor based on the average capacitance.

6. An apparatus comprising:
    a touch sensor comprising a plurality of sense electrodes;
    a plurality of compensation buffers operable to receive a plurality of partial capacitances, respectively, from the plurality of sense electrodes, respectively, and to scale the plurality of partial capacitances, respectively, to create a plurality of scaled capacitances;
    a current summer/divider operable to receive the plurality of scaled capacitances from the plurality of compensation buffers and determine an average capacitance of the plurality of scaled capacitances from the plurality of compensation buffers; and at least one processor operable to:

receive, from the current summer/divider, the average capacitance of the plurality of scaled capacitances from the plurality of compensation buffers;

subtract the average capacitance of the plurality of scaled capacitances of the plurality of compensation buffers from a total capacitance associated with one of the plurality of sense electrodes to determine a capacitance associated with a touch input on the touch sensor; and determine a location on the touch sensor associated with the touch input based on the determined capacitance associated with the touch input.

7. The apparatus of claim 6, wherein each of the plurality of sense lines have a total capacitance comprising:

a first capacitance associated with the touch; and a second capacitance comprising a parasitic capacitance.

8. The apparatus of claim 7, wherein the plurality of compensation buffers are operable to scale the plurality of partial capacitances, respectively, by adding or subtracting an amount of capacitance to result in the second capacitance of each of the plurality of respective scaled capacitances being substantially equal.

9. The apparatus of claim 6, further comprising an input buffer operable to generate, based on the plurality of scaled capacitances, a first output signal and a second output signal, and wherein:

the current summer/divider is operable to use the first output signal when determining the average capacitance of the plurality of scaled capacitances; and the at least one processor is operable to use the second output signal when subtracting the average capacitance from the total capacitance associated with one of the plurality of sense lines.

10. The apparatus of claim 6, further comprising a proximity circuit operable to detect an inadvertent touch on the touch sensor based on the average capacitance.

11. A method comprising:

scaling a plurality of partial capacitances received from a plurality of sense lines, respectively, of a touch sensor to create a plurality of scaled capacitances;

determining an average capacitance of the plurality of respective scaled capacitances from the plurality of compensation buffers;

subtracting the average capacitance of the plurality of scaled capacitances from the plurality of compensation buffers from a total capacitance associated with one of the plurality of sense lines to determine a capacitance associated with a touch input on the touch sensor; and determining a location on the touch sensor associated with the touch input based on the determined capacitance associated with the touch input.

12. The method of 11, wherein each of the plurality of sense lines have a total capacitance comprising:

a first capacitance associated with the touch input; and a second capacitance comprising a parasitic capacitance.

13. The method of claim 12, wherein scaling the plurality of partial capacitances, respectively, comprises:

adding or subtracting an amount of capacitance to result in the second capacitance of each of the plurality of scaled capacitances being substantially equal.

14. The method of claim 11, further comprising:

generating, based on the plurality of scaled capacitances, a first output signal and a second output signal, and wherein the first output signal is used when determining the average capacitance of the plurality of scaled capacitances; and wherein the second output signal is used when subtracting the average capacitance from the total capacitance associated with one of the plurality of sense lines.

15. The method of claim 11, further comprising detecting an inadvertent touch on the touch sensor based on the average capacitance.

* * * * *